United States Patent
Pletka et al.

(10) Patent No.: US 11,875,831 B2
(45) Date of Patent: Jan. 16, 2024

(54) PAGE GROUP READ VOLTAGE THRESHOLD CALIBRATION

(71) Applicant: INTERNATIONAL BUSINESS MACHINES CORPORATION, Armonk, NY (US)

(72) Inventors: Roman Alexander Pletka, Uster (CH); Radu Ioan Stoica, Zurich (CH); Nikolas Ioannou, Zurich (CH); Nikolaos Papandreou, Thalwil (CH); Charalampos Pozidis, Thalwil (CH); Timothy J. Fisher, Cypress, TX (US); Aaron Daniel Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 17/562,772

(22) Filed: Dec. 27, 2021

(65) Prior Publication Data
US 2023/0207023 A1    Jun. 29, 2023

(51) Int. Cl.
*G11C 16/26*    (2006.01)
*H10B 41/27*    (2023.01)
(Continued)

(52) U.S. Cl.
CPC .............. *G11C 16/26* (2013.01); *G11C 5/025* (2013.01); *G11C 16/14* (2013.01); *G11C 29/021* (2013.01); *H10B 41/27* (2023.02); *H10B 43/27* (2023.02)

(58) Field of Classification Search
CPC ......... G11C 16/26; G11C 5/025; G11C 16/14; G11C 29/021; G11C 2029/0411;
(Continued)

(56) References Cited

U.S. PATENT DOCUMENTS 10,222,997 B2    3/2019    Camp
10,453,537 B1    10/2019   Reuter
(Continued)

FOREIGN PATENT DOCUMENTS

TW    201438015 A    10/2014

OTHER PUBLICATIONS

WIPO, International Search Report and Written Opinion, International Appln. PCT/EP 2022/083256, dated Feb. 14, 2023, 13 pages.
(Continued)

*Primary Examiner* — Hoai V Ho
*Assistant Examiner* — Minh Dinh
(74) *Attorney, Agent, or Firm* — Brian F. Russell; Eyal Gilboa

(57) ABSTRACT

A controller of a non-volatile memory detects errors in data read from a particular physical page of the non-volatile memory. Based on detecting the errors, the controller performs a read voltage threshold calibration for a page group including the particular physical page and a multiple other physical pages. Performing the read voltage threshold calibration includes calibrating read voltage thresholds based on only the particular physical page of the page group. After the controller performs the read voltage threshold calibration, the controller optionally validates the calibration. Validating the calibration includes determining whether bit error rates diverge within the page group and, if so, mitigating the divergence. Mitigating the divergence includes relocating data from the page group to another block of the non-volatile memory.

20 Claims, 8 Drawing Sheets

(51) Int. Cl.
*H10B 43/27* (2023.01)
*G11C 5/02* (2006.01)
*G11C 16/14* (2006.01)
*G11C 29/02* (2006.01)

(58) Field of Classification Search
CPC ... G11C 16/3404; G11C 29/028; G11C 29/52; G11C 16/34; H10B 41/27; H10B 43/27
USPC ........................................... 365/185.2
See application file for complete search history.

(56) References Cited

U.S. PATENT DOCUMENTS

| 10,699,791 | B2 | 6/2020 | Pletka |
| 2014/2936961 | | 10/2014 | Wei |
| 2016/0110248 | A1* | 4/2016 | Camp ............... G06F 3/0604 714/54 |
| 2019/0066802 | A1 | 2/2019 | Malshe |
| 2019/3917461 | | 12/2019 | Nikolaos |
| 2020/0082878 | A1 | 3/2020 | Papandreou |
| 2020/0118620 | A1* | 4/2020 | Bazarsky ............... G11C 29/42 |
| 2020/2649441 | | 8/2020 | Mehta |
| 2020/0411117 | A1 | 12/2020 | Malshe et al. |
| 2021/0012857 | A1 | 1/2021 | Xie |
| 2021/0133025 | A1 | 5/2021 | Aklik |
| 2021/0134377 | A1 | 5/2021 | Papandreou et al. |

OTHER PUBLICATIONS

U.S. Appl. No. 16/669,264, Papandreou Nikolaos.
Office Action, dated Jun. 29, 2023, 6 pages, Taiwan Intellectual Property Office with English machine translation.
Taiwan Intellectual Property Office, Notice of Allowance for Appln. No. 111126221, dated Sep. 13, 2023, 4 pages.
Taiwan Intellectual Property Office, Notice of Allowance for Appln. No. 111126221, dated Sep. 13, 2023, 4 pages (English Translation).

* cited by examiner

PAGE GROUP READ VOLTAGE THRESHOLD CALIBRATION

BACKGROUND OF THE INVENTION

The present disclosure is generally directed to data storage and, more particularly, to non-volatile memory systems. Still more particularly, the present disclosure is directed to read voltage threshold calibration in non-volatile memory systems.

NAND flash memory is an electrically programmable and erasable non-volatile memory technology that stores one or more bits of data per memory cell as a charge on the floating gate of a transistor or a similar charge trap structure. In typical implementations, a NAND flash memory array is organized in physical blocks of memory, each of which includes multiple physical pages stored in a multiplicity of memory cells. By virtue of the arrangement of the wordlines and bitlines utilized to access memory cells, flash memory arrays can generally be programmed on a page basis, but are erased on a block basis.

As is known in the art, blocks of NAND flash memory must be erased prior to being programmed with new data. Following erasure, NAND flash memory cells can be programmed by applying a positive high program voltage to the wordline of the memory cells to be programmed and by applying an intermediate pass voltage to the memory cells in the same string in which programming is to be inhibited. Application of the program voltage causes tunneling of electrons onto the floating gate of a memory cell to change its state from an initial erased state to a programmed state having a net negative charge. The voltage of the gate in relation to one or more read voltage thresholds indicates the bit value(s) stored in the memory cell.

Due to program/erase cycling, data retention, read disturb, program disturb, and/or other causes, the programmed voltage distributions of memory cells may change during operation of a NAND flash device. In response to the changes in the programmed voltage distributions, a controller can perform calibration to adjust the read voltage thresholds to reduce a bit error rate (BER). For example, some prior art controllers account for permanent and temporary changes in the voltage distributions by calculating optimal offset(s) from initial read voltage thresholds based on both permanent effects (e.g., due to cycling wear) and temporary effects (e.g., due to data retention and read disturb). These optimal offset(s) may be determined utilizing an iterative algorithm that issues multiple page reads utilizing different offsets. To reduce the calibration overhead and read voltage threshold metadata, physical pages may be grouped in page groups, which can each be formed, for example, of all the physical pages coupled to a common wordline, of all physical pages in one or more vertically stacked physical layers of a 3D NAND flash memory, of a set of physical pages in a physical layer with the same page type (i.e., upper pages, lower pages, extra pages, or top pages), or generally of physical pages with similar characteristics. In general, each time calibration of read voltage thresholds is triggered, the controller performs read voltage threshold calibration on an entire physical block.

BRIEF SUMMARY

The present disclosure appreciates that conventional read voltage threshold calibration does not provide as good of performance and error reduction as is desirable. For example, calibrating an entire physical block due to a failed read imposes a significant latency in the performance-critical read path for hosts. Further, in some prior art systems, each page group within a physical block undergoing read voltage threshold calibration is separately calibrated based on a randomly selected physical page in the page group. As a result of this random selection, the physical page that triggered the read voltage threshold calibration may not be utilized as the basis for calibration of its own page group. Consequently, because of differing expressions of error effects (e.g., read disturb, rowhammer, retention, program disturb, flash media issues, etc.) among different physical pages, the optimal read voltage thresholds determined for a particular page group may not be applicable for all physical pages in that page group and may not even enable correction of the errors in the physical page that triggered the read voltage threshold calibration.

In at least one embodiment, a controller of a non-volatile memory detects errors in data read from a particular physical page of the non-volatile memory. Based on detecting the errors, the controller performs a read voltage threshold calibration for a page group including the particular physical page and a multiple other physical pages. Performing the read voltage threshold calibration includes calibrating read voltage thresholds based on only the particular physical page of the page group. After the controller performs the read voltage threshold calibration, the controller optionally validates the calibration. Validating the calibration includes determining whether bit error rates diverge within the page group and, if so, mitigating the divergence. Mitigating the divergence includes relocating data from the page group to another block of the non-volatile memory.

DETAILED DESCRIPTION

Figure 1:
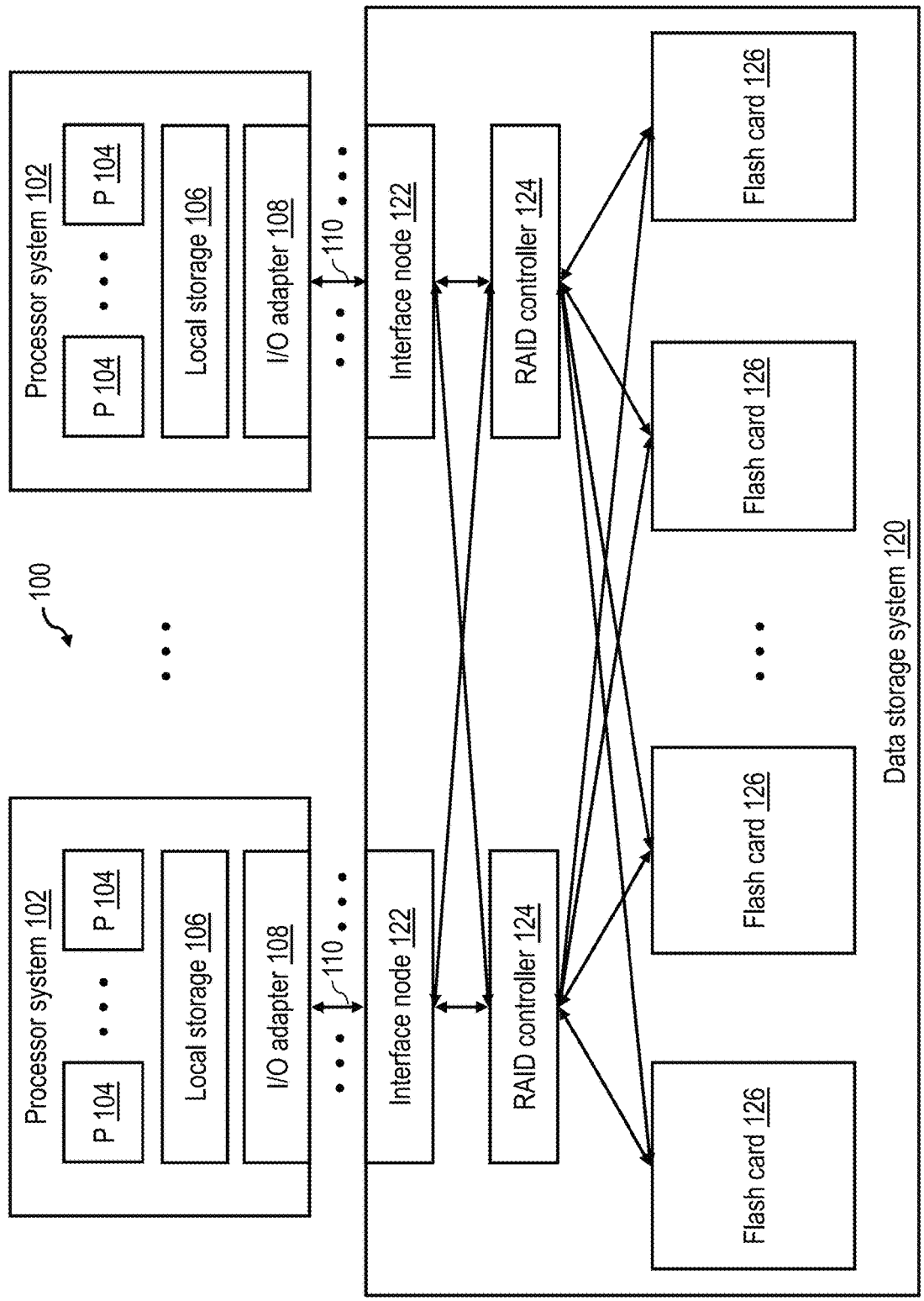
FIG. 1 is a high level block diagram of a data processing environment in accordance with one embodiment.

With reference to the figures and with particular reference to FIG. 1, there is illustrated a high-level block diagram of an exemplary data processing environment 100 including a data storage system 120 as described further herein. As shown, data processing environment 100 includes one or more hosts, such as a processor system 102 having one or more processors 104 that process instructions and data. Processor system 102 may additionally include local storage 106 (e.g., DRAM or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER® series available from International Business Machines Corporation), or a mainframe computer system. Processor system 102 can also be an embedded processor system using various processors such as ARM®, POWER, Intel x86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), Non-volatile Memory Express (NVMe), NVMe over Fabrics (NVMe-oF), etc. I/O commands communicated via I/O channel 110 include host read commands by which a processor system 102 requests data from data storage system 120 and host write commands by which a processor system 102 requests storage of data in data storage system 120.

In the illustrated embodiment, data storage system 120 includes multiple interface nodes 122 through which data storage system 120 receives and responds to I/O commands via I/O channels 110. Each interface node 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, other lossy storage media can be employed.

Figure 2:
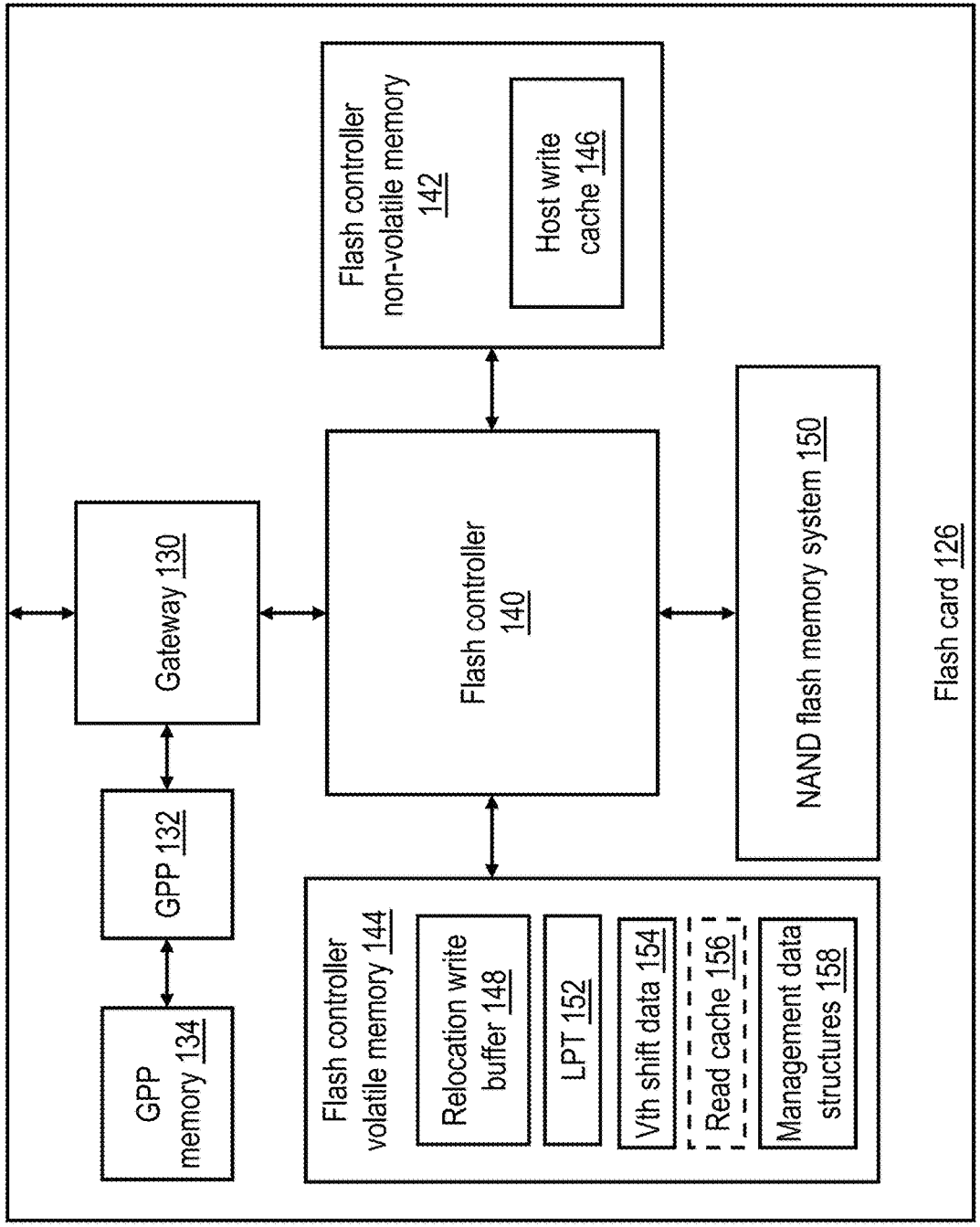
FIG. 2 is a more detailed block diagram of an exemplary flash card of the data storage system of FIG. 1 in accordance with one embodiment.

FIG. 2 depicts a more detailed block diagram of a flash card 126 of data storage system 120 of FIG. 1 in accordance with one embodiment. In this embodiment, flash card 126 includes a gateway 130 that serves as an interface between flash card 126 and RAID controllers 124. Gateway 130 is coupled to a general-purpose processor (GPP) 132, which can be configured (e.g., by program code) to perform various management functions, such as pre-processing of I/O commands received by gateway 130, scheduling servicing of the I/O commands by flash card 126, and/or performing other management functions. GPP 132 is coupled to a GPP memory 134 (e.g., dynamic random access memory (DRAM)) that can conveniently buffer data created, referenced, and/or modified by GPP 132 in the course of its processing.

Gateway 130 is further coupled to at least one flash controller 140, which controls a bulk non-volatile memory system, such as a NAND flash memory system 150. Flash controller 140 services I/O commands, for example, by accessing NAND flash memory systems 150 to read or write the requested data from or into NAND flash memory system 150, as discussed further below. In various embodiments, flash controller 140 can be implemented, for example, by an Application Specific Integrated Circuit (ASIC) or a Field Programmable Gate Array (FPGA)). In embodiments in which flash controller 140 is implemented with an FPGA, GPP 132 may program and configure flash controller 140 during start-up of data storage system 120 based on program code in GPP memory 134.

Flash controller 140 is coupled to flash controller memory, which in this embodiment includes both flash controller non-volatile memory 142 and flash controller volatile memory 144. Flash controller non-volatile memory 142 may be implemented, for example, with MRAM, FRAM, PCM, battery-backed DRAM, or other non-volatile memory technology, and flash controller volatile memory 144 may be implemented with a relatively inexpensive volatile memory technology, such as DRAM. As further indicated in FIG. 2, flash controller non-volatile memory 142 can include a host write cache 146 for buffering host write data associated with host write commands received from hosts, such as processor systems 102.

Flash controller 140 implements a Flash Translation Layer (FTL) that provides logical-to-physical address translation to enable access to specific memory locations within NAND flash memory systems 150. In general, an I/O command received by flash controller 140 from a host device, such as a processor system 102, contains the logical block address (LBA) at which the data is to be accessed (read or written) and, if a host write command, the host write data to be written to data storage system 120. The I/O command may also specify the amount (or size) of the data to be accessed. Other information may also be communicated depending on the protocol and features supported by data storage system 120. As is known to those skilled in the art, in some implementations of NAND flash memory, the smallest granule of data that can be accessed by a host read or host write command is a single codeword, which may be, for example, 8 or 16 kilobytes (kB). The LBA provided by the host device corresponds to a logical page within a logical address space, which may have a size, for example, of 4 kB or 16 kB. This logical page can be further compressed by flash controller 140 so that each physical page can store one or more logical pages. The FTL translates the LBA into a physical address assigned to a corresponding physical location in NAND flash memory system 150. Flash controllers 140 may store mappings between logical and physical addresses in a logical-to-physical translation data structure, such as a logical-to-physical translation (LPT) table 152, which may conveniently be stored in flash controller volatile memory 144.

As further shown in FIG. 2, in the depicted embodiment, flash controller volatile memory 144 additionally includes a relocation write buffer 148 for buffering data collected by the garbage collection process that is to be relocated within NAND flash memory system 150. In addition, flash controller volatile memory 144 may optionally include a read cache 156 for buffering data from NAND flash memory system 150 that has been recently and/or frequently requested by host read commands. Flash controller 140 may also store within flash controller volatile memory 144 voltage threshold (Vth) shift data 154 utilized to calibrate the read voltage thresholds of the various subsets (e.g., page groups) of NAND flash memory system 150, as well as other management data structures 158 storing management data such as bit error rate (BER), program/erase (P/E) cycle counts, read counts, and other block, page group, and page statistics.

NAND flash memory systems 150 may take many forms in various embodiments. Referring now to FIGS. 3-6, there is depicted an exemplary arrangement of physical memory within a NAND flash memory system 150 in accordance with one embodiment.

Figure 3:
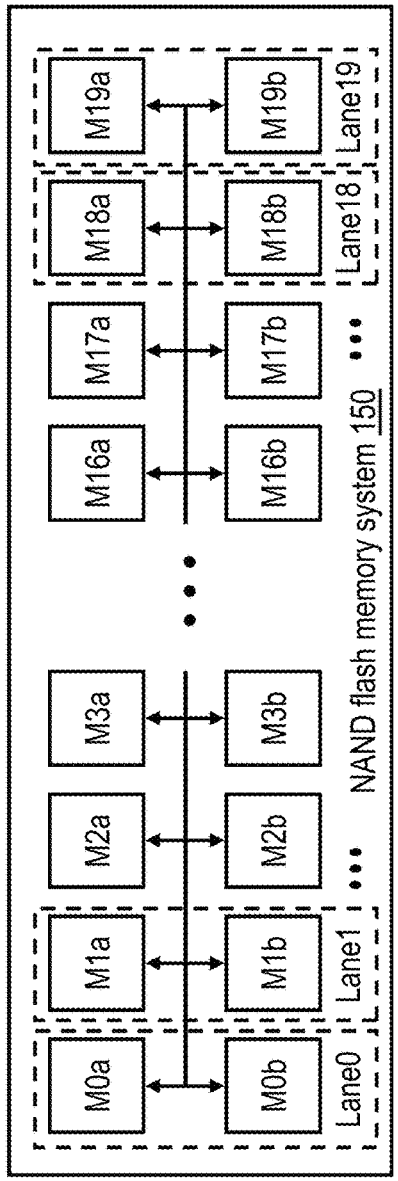
FIGS. 3-6 illustrate an exemplary arrangement of physical memory within a NAND flash memory system in accordance with one embodiment.

As shown in FIG. 3, NAND flash memory system 150 may be formed from forty (40) individually addressable NAND flash memory storage devices. In the illustrated example, each of the flash memory storage devices M0a-M19b takes the form of a board-mounted flash memory module capable of storing two or more bits per cell. In one particular embodiment, the memory modules are implemented with Quad Level Cell (QLC) NAND flash memory, which is configured to operate in a hybrid tiered arrangement including a first pool of physical blocks operating in QLC mode and a second pool of physical blocks operating in a single level cell (SLC) mode. The forty NAND flash memory modules are arranged in twenty groups of two, (M0a, M0b) through (M19a, M19b). For purposes of the physical addressing scheme, each group of two modules forms a "lane," also sometimes referred to as a "channel," such that NAND flash memory system 150 includes twenty channels or lanes (Lane0-Lane19).

In a preferred embodiment, each of the individual lanes has a respective associated bus coupling it to the associated flash controller 140. Thus, by directing its communications to one of the specific communication buses, flash controller 140 can direct its communications to one of the lanes of memory modules. Because each communication bus for a given lane is independent of the communication buses for the other lanes, flash controller 140 can issue commands and send or receive data across the various communication buses at the same time, enabling the flash controller 140 to access the flash memory modules corresponding to the individual lanes at, or very nearly at, the same time.

Figure 4:
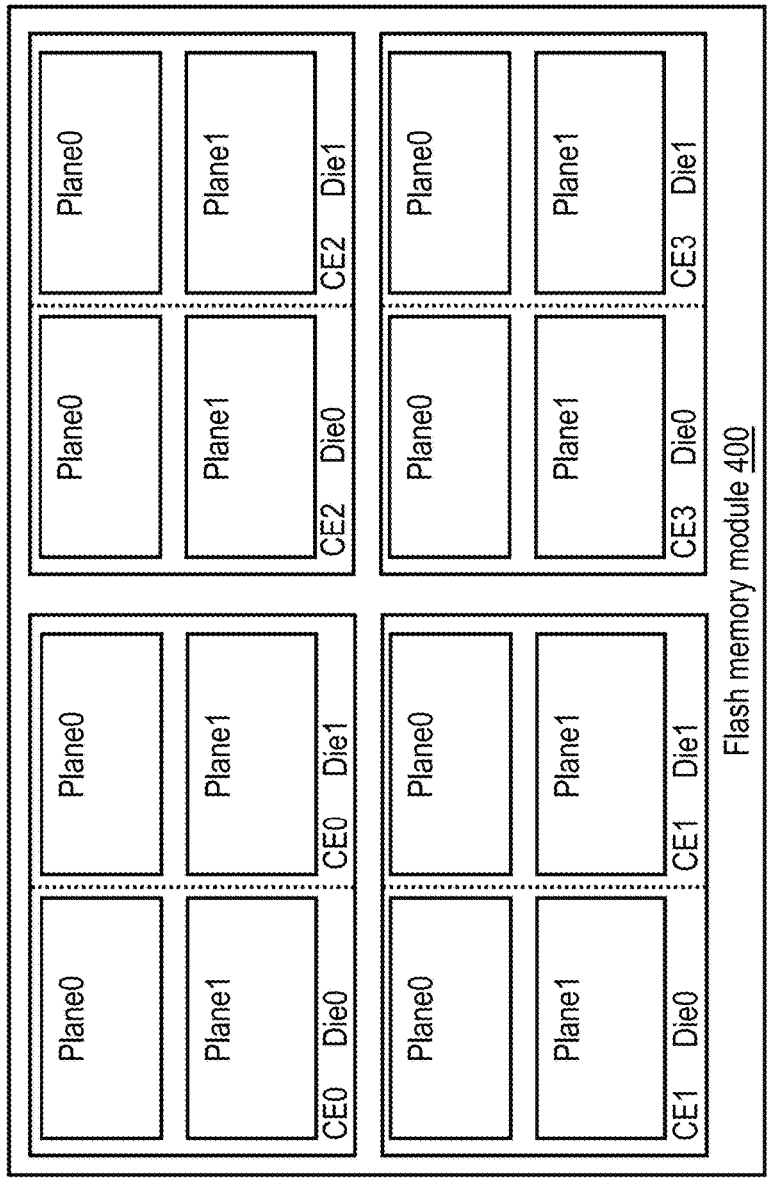

With reference now to FIG. 4, there is illustrated an exemplary embodiment of a flash memory module 400 that can be utilized to implement any of flash memory modules M0a-M19b of FIG. 3. As shown in FIG. 4, the physical storage locations provided by flash memory module 400 are further subdivided into physical locations that can be addressed and/or identified through Chip Enables (CEs). In the example of FIG. 4, the physical memory of each flash memory chip 400 is divided into four Chip Enables (CE0, CE1, CE2 and CE3), each having a respective CE line that is asserted by flash controller 140 to enable access to or from the physical memory locations within the corresponding CE. Each CE is in turn subdivided into multiple dice (e.g., Die0 and Die1) each having two or four planes (e.g., Plane0 and Plane1). Each plane represents a collection of physical blocks that, because of the physical layout of the flash memory chips, are physically associated with one another and utilize common circuitry (e.g., I/O buffers) for the performance of various operations, such as read and write operations.

Figure 6:
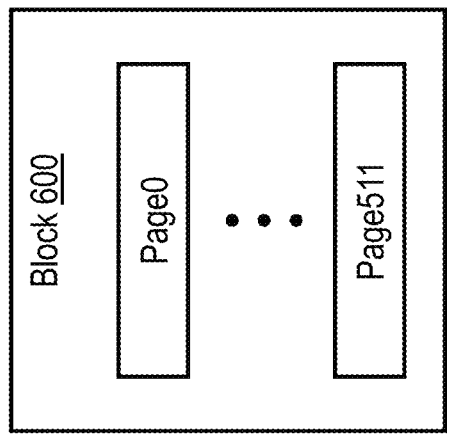
Figure 5:
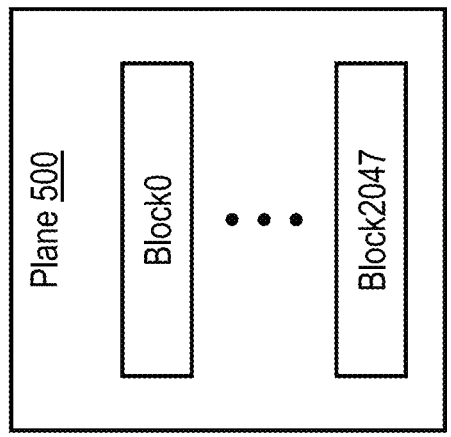

As further shown in FIGS. 5-6, an exemplary plane 500, which can be utilized to implement any of the planes within flash memory module 400 of FIG. 4, includes, for example, 512, 2048, or 4096 blocks of physical memory. Some manufacturers include additional blocks to this nominal block count as some blocks may fail early due to manufacturing defects. In general, a block is a collection of physical pages that are associated with one another, typically in a physical manner. This association is such that a block is defined to be the smallest granularity of physical storage locations that can be erased within NAND flash memory system 150. In the embodiment of FIG. 6, each block 600 includes several hundreds or thousands of pages, for example, 512, 1024, or 4096 physical pages, where a physical page is defined to be the smallest individually addressable data unit for read and write access. In the exemplary system, each physical page of data has a common capacity (e.g., 16 kB) for data storage plus additional storage for page metadata. Thus, data is typically written into or read from NAND flash memory system 150 on a page-by-page basis, but erased on a block-by-block basis.

In at least some embodiments, each physical page in a block 600 is assigned to a page group containing two or more physical pages. A controller (e.g., GPP 132 or flash controllers 140) may assign physical pages of a block 600 to a page group based on the expected similarity of the characteristics (e.g., error characteristics) of the physical pages due to the physical page being of the same page type (e.g., lower page, upper page, extra page, top page, etc.), being fabricated in the same physical layer of chip, etc.

Because the FTL implemented by data storage system 120 isolates the logical address space made available to host devices from the physical memory within NAND flash memory system 150, the size of NAND flash memory system 150 need not be equal to the size of the logical address space presented to host devices. In most embodiments it is beneficial to present a logical address space that is smaller in size than the total available physical memory (i.e., it is beneficial to over-provision NAND flash memory system 150). Over-provisioning in this manner ensures that physical memory resources are available when the logical address space is fully utilized, even given the presence of a certain amount of invalid data as described above. In addition to accommodating invalid data that has not yet been reclaimed, the over-provisioned space can be used to ensure there is adequate logical space, even given the presence of memory failures and the memory overhead entailed by the use of data protection schemes, such as Error Correcting Code (ECC), Cyclic Redundancy Check (CRC), and parity.

In some embodiments, data is written to NAND flash memory system 150 one physical page at a time. In other embodiments in which more robust error recovery is desired, data is written to groups of associated physical pages of NAND flash memory system 150 referred to herein as "page stripes." In one embodiment, all pages of a page stripe are associated with different lanes to achieve high write bandwidth. Because in many implementations the smallest erase unit is a block, multiple page stripes can be grouped into a block stripe, where each block in the block stripe is associated with a different lane. When a block stripe is built, any free block of a lane can be chosen, but preferably all blocks within the same block stripe have the same or similar health grade. Note that the block selection can be further restricted to be from the same plane, die, and/or chip enable. The lengths of the block stripes can vary, but in one embodiment in which NAND flash memory system 150 includes 20 lanes, each block stripe includes between two and twenty blocks, with each block coming from a different lane.

Once a block from each lane has been selected and a block stripe is formed, page stripes are preferably formed from physical pages with the same page number from all blocks in the block stripe. While the lengths of the various page stripes stored into NAND flash memory system 150 can vary, in one embodiment each page stripe includes one to twenty data pages of write data (typically provided by a host device). In another embodiment, a page stripe includes one to nineteen data pages of write data and one additional page (a "data protection page") used to store data protection information for the write data. The data protection page can be placed on any lane of the page stripe containing a non-retired page, but typically is on the same lane for all page stripes of the same block stripe to minimize metadata information. The addition of a data protection page as illustrated requires that garbage collection be performed for all page stripes of the same block stripe at the same time. After garbage collection of the block stripe completes, the block stripe can be dissolved, and each block can be placed into the relevant ready-to-use (RTU) queue as explained below.

Having described the general physical structure and operation of exemplary embodiments of a data storage system 120, certain operational aspects of data storage system 120 are now described with reference to FIG. 7, which is a high-level data flow diagram illustrating the flash management functions and data structures employed by a controller of a NAND flash memory system 150 (e.g., GPP 132 and/or flash controller 140) in accordance with one embodiment.

As noted above, data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., RAID controllers 124, flash controllers 140, and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 152, which can be stored in the associated flash controller volatile memory 144. It should be noted that the logical address supplied to flash controllers 140 may be different from the logical address originally supplied to data storage system 120, since various components within data storage system 120 may perform address translation operations between the external devices and the flash controllers 140.

Flash management code running on the GPP 132 tracks erased blocks of NAND flash memory system 150 that are ready to be used in ready-to-use (RTU) queues 700, which may be stored, for example, in GPP memory 134. In the depicted embodiment, flash management code running on the GPP 132 preferably maintains one or more RTU queues 700 per plane or channel, and an identifier of each erased block that is to be reused is enqueued in one of the RTU queues 700 corresponding to its channel. For example, in one embodiment, RTU queues 700 include, for each channel, a respective RTU queue 700 for each of a plurality of block health grades. In various implementations, between 2 and 8 RTU queues 700 per plane (and a corresponding number of block health grades) have been found to be sufficient.

A build block stripes function 702 (e.g., performed by flash management code running on the GPP 132) constructs new block stripes from the erased blocks enqueued in RTU queues 700. As noted above, block stripes are preferably formed of blocks of the same or similar health (i.e., expected remaining useful life) residing in different channels, meaning that block stripes can conveniently be constructed by build block stripes function 702 by drawing each block of the new block stripe from corresponding RTU queues 700 of different planes or channels. The new block stripe is then queued to flash controller 140 for data placement by a data placement function 704.

Data placement function 704 includes open block queues 706, which track identifiers of not-fully programmed blocks in the block stripes constructed by build block stripes function 702. As further illustrated in FIG. 7, data placement function 704 additionally includes a caching engine 714 for writing host write data into host write cache 146 and for writing relocation write data into relocation write buffer 148. Data placement function 704 also includes a destaging engine 716 for writing data from host write cache 146 and relocation write buffer 148 into open blocks of NAND flash memory system 150 identified in open block queues 706.

In response to a host write command received from a host such as a processor system 102, data placement function 704 of flash controller 140 determines by reference to LPT table 152 whether the target LBA(s) indicated in the host write command is/are currently mapped to physical page(s) in NAND flash memory system 150 and, if so, changes the status of each data page currently associated with a target LBA to indicate that it is no longer valid. Caching engine 714 additionally writes the host write data of the host write command into host write cache 146. Once the update to host write cache 146 is complete, caching engine 714 can immediately provide an acknowledgement message ("Ack") to the issuing host via I/O channel 110. Caching engine 714 also updates the entry in LPT 704 for the LBA indicated by the host write command to point to the location of the host write data in host write cache 146.

To service a host write command, data placement function 702 additionally allocates a page stripe if necessary to store the write data of the host write command and any non-updated data (i.e., in case the write request is smaller than a logical page, there is still valid data which needs to be handled in a read-modify-write manner) from an existing page stripe, if any, targeted by the host write command, and/or stores the write data of the host write command and any non-updated (i.e., still valid) data from an existing page stripe, if any, targeted by the host write command to an already allocated page stripe that has free space left. The page stripe may be allocated from either a block stripe already allocated to hold data or from a new block stripe. In a preferred embodiment, the page stripe allocation can be based on the health of the blocks available for allocation and the "heat" (i.e., estimated or measured write access frequency) of the LBA of the write data. Destaging engine 716 of data placement function 704 then writes the host write data and associated metadata (e.g., CRC and ECC values) for each codeword from host write cache 146 into pages of the allocated page stripe identified in open block queues 706, and additionally, writes parity information into the data protection page of the allocated page stripe, if needed. Destaging engine 716 also updates LPT table 152 to associate the LBA(s) of the host write data with addresses of the physical page(s) in NAND flash memory 150 utilized to store the write data. Thereafter, flash controller 140 can access the data from NAND flash memory 150 to service host read commands by reference to LPT table 152.

Once all pages in a block stripe have been written or the block stripe is otherwise closed, flash controller 140 places an identifier of the block stripe on one of occupied block queues 708, which flash management code running on the GPP 132 utilizes to track blocks for garbage collection and other management functions. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 720. Garbage collector 720 selects particular block stripes for garbage collection based on a number of factors including, for example, the health of the physical blocks within the block stripes and how much of the data within the physical blocks is invalid. In at least one embodiment, garbage collection is performed on entire block stripes, and garbage collector 720 issues relocation write commands to caching engine 714 of data placement function 704 to relocate the still-valid data in a garbage-collected block stripe to another block stripe. In NAND flash memory systems 150 implementing hybrid tiered arrangement including a first pool of physical blocks operating in higher storage density mode (e.g., QLC mode) and a second pool of physical blocks operating in a lower storage density mode (e.g., SLC mode), it is desirable to permit garbage-collected data to be written from old blocks operating in either mode to new blocks operating in either mode. Thus, the relocation write commands issued by garbage collector 720 may specify the desired operating mode of the target block stripe to support, for example, QLC-to-QLC, SLC-to-QLC, SLC-to-SLC, or QLC-to-SLC garbage collection.

Figure 7:
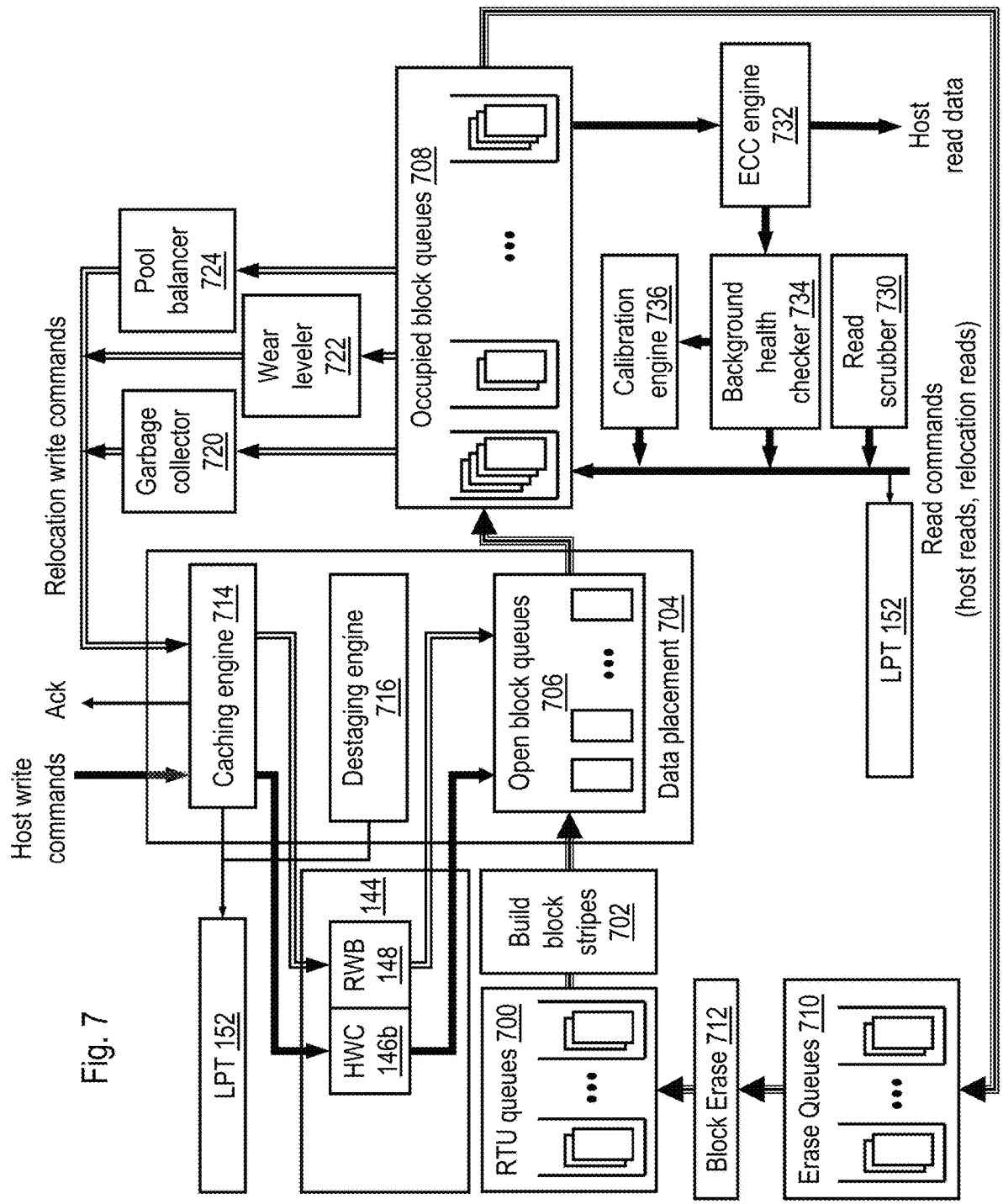
FIG. 7 is a high-level data flow diagram of the flash management functions and data structures employed by a controller of a NAND flash memory system in accordance with one embodiment.

As further indicated in FIG. 7, the flash management functions performed by GPP 132 and/or flash controller 140 additionally include a wear leveler 722 that requests relocation of data held in block stripes in occupied block queues 708 to equalize wear across blocks and a pool balancer 724 that requests the relocation of data held in certain block stripes to allow some or all of the constituent blocks to be reconfigured to operate in a different operating mode (e.g., QLC or SLC).

Based on the relocation write commands received from garbage collector 720, wear leveler 722, and pool balancer 724, caching engine 714 stores relocation write data from the old block stripes into relocation write buffer 148 in flash controller volatile memory 144. In addition, caching engine 714 may update LPT table 152 to additionally point to the location in relocation write buffer 148. Once all still valid data has been moved from the old block stripe and written to new pages of the allocated page stripes identified in open block queues 706, destaging engine 716 updates LPT table 152 to remove the current association between the logical and physical addresses of the data and to associate the LBA(s) of the relocated data with addresses of the physical page(s) in NAND flash memory 150 utilized to store the relocated data. Then, the old block stripe is dissolved, thus disassociating the blocks, and identifiers of the blocks are enqueued in erase queues 710, which may include one erase queue 710 per channel. A block erase function 712 of flash controller 140 then erases each of the blocks formerly forming the dissolved block stripes and increments an associated program/erase (P/E) cycle count for the block in management data structures 158. Based on the health metrics of each erased block, each erased block is either retired (i.e., no longer used to store user data), or alternatively, prepared for reuse by placing the block's identifier on the appropriate ready-to-use (RTU) queue 700 in the associated GPP memory 134.

FIG. 7 further illustrates that the flash management functions of GPP 132 and/or flash controller 140 additionally include receiving and servicing a variety of different read commands. These read commands include host read commands, which specify LBAs that are translated into physical addresses by reference to LPT 152. In addition, the read commands include relocation read commands issued to facilitate the work of garbage collector 720, wear leveler 722, and pool balancer 724, as previously described. The read commands can also include read commands initiated by read scrubber 730, which periodically traverses all pages in all occupied blocks in order to ensure that the data remains readable after retention.

In response to the various read commands, flash controller 140 initiates reads of one or more codewords from the relevant physical pages of NAND flash memory system 150. Each codeword read from NAND flash memory system 150 is processed by error correcting code (ECC) engine 732 to detect and to correct, if possible, bit errors (if any) in the codeword. ECC engine 732 forwards data read by host read commands to the requesting host (e.g., one of processor systems 102) following correction. ECC engine 732 additionally reports codewords having a high bit error rate (BER) to background health checker 734. Based on a report of a codeword having a high BER, background health check 734 selectively commands calibration engine 736 to perform read voltage threshold calibration and/or data validation on one or more page groups of the block containing the codeword, as described further below with reference to FIGS. 10-11.

Figure 8:
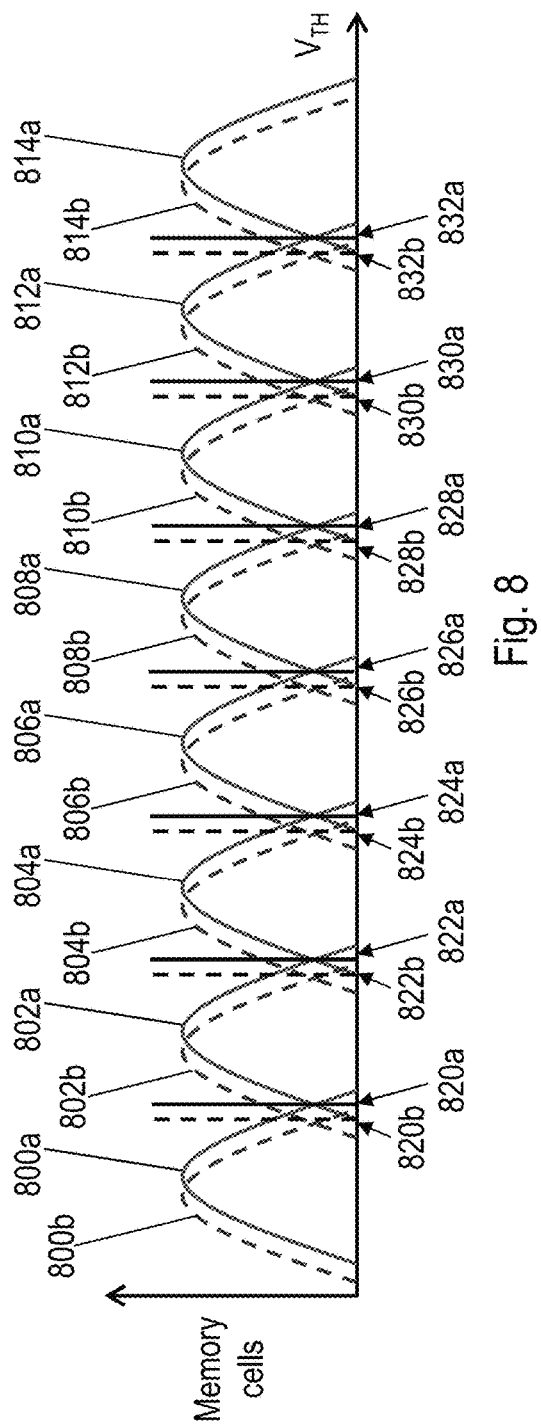
FIG. 8 depicts initial and subsequent programmed voltage distributions for an exemplary three-level cell (TLC) NAND flash memory.

As noted above, the programmed voltage distributions of memory cells may change during operation of a NAND flash device, for example, due to program/erase cycling, data retention, read disturb, program disturb, rowhammer effects, and/or other causes. FIG. 8 illustrates one example of initial and subsequent programmed voltage distributions for memory cells in block of an exemplary three-level cell (TLC) NAND flash memory. In particular, FIG. 8 depicts eight voltage distributions 800a, 802a, 804a, 806a, 808a, 810a, 812a, and 814a, each representing a different respective three-bit value programmed into memory cells of the block of TLC NAND flash memory. As initially programmed, the bit values stored in the individual memory cells are distinguished by reference to seven initial read voltage thresholds 820a, 822a, 824a, 826a, 828a, 830a, and 832a.

FIG. 8 illustrates an operating scenario in which, over time, charge de-trapping causes the voltage distributions to shift toward lower voltages, as shown by subsequent voltage distributions 800b, 802b, 804b, 806b, 808b, 810b, 812b, and 814b. Without a calibration of the read voltage thresholds to accommodate the shift in the voltage distributions, errors in reading data from the memory cells can increase to the point that the errors are no longer correctable by ECC engine 732 and the data stored in the memory cells is no longer readable. Consequently, to reduce data errors and avoid data loss, a controller of the TLC NAND flash memory preferably performs read voltage threshold calibration to determine the voltage offsets required to achieve improved read voltage thresholds 820b, 822b, 824b, 826b, 828b, 830b, and 832b for subsequent voltage distributions 800b, 802b, 804b, 806b, 808b, 810b, 812b, and 814b.

In at least one embodiment, a controller (e.g., GPP 132 and/or flash controller 140) implements a calibration engine 736 that, in various calibration operations, performs calibrations of different scope. For example, in the embodiment of FIG. 9, calibration engine 736 can perform either a "full block calibration" encompassing all page groups in a given block or a "single page group calibration" on only a single page group of the block. In this depicted embodiment, if calibration engine 736 elects to perform a single page group calibration, calibration engine 736 preferably establishes read voltage thresholds utilized to read all of the physical pages in a page group based on the optimal voltage thresholds for an affected page in the page group that, when read, triggered the calibration. An example of this single page group calibration is described in greater detail below with reference to block 1020 of FIG. 10. Following calibration of the single affected page, which is deemed to be representative of all physical pages in the page group, calibration engine 736 may apply the voltage thresholds determined for the affected page to all physical pages in the page group. Calibration engine 736 may also optionally validate the calibration, as discussed below with respect to blocks 1022-1024 of FIG. 10 and FIG. 11.

Figure 9:
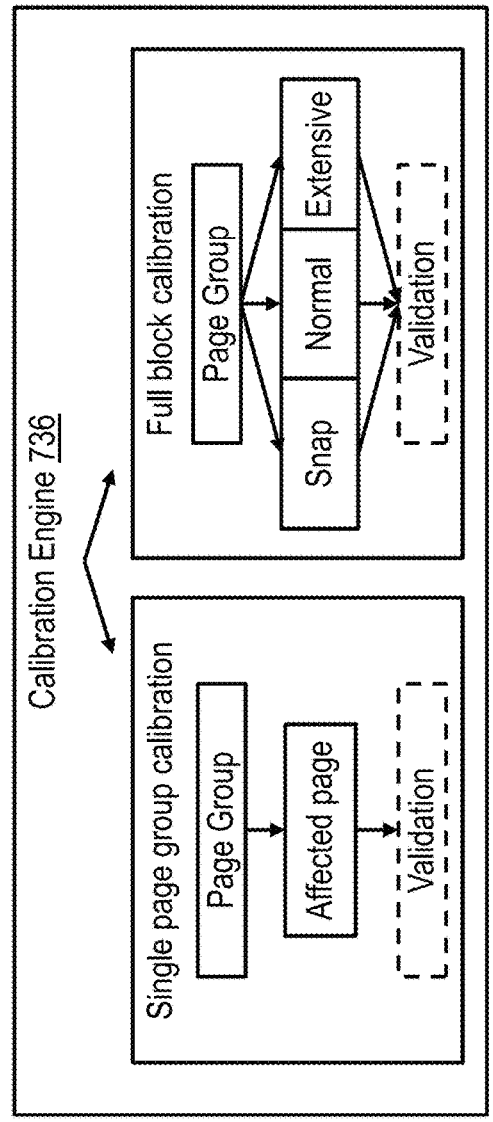
FIG. 9 illustrates differing read voltage threshold calibration techniques implemented by a calibration engine in accordance with one embodiment.

FIG. 9 further illustrates that, in some cases, calibration engine 736 may elect to perform full block calibration by iteratively performing page group calibration for each and every page group in a block. An example of this full block calibration is described in greater detail below with reference to blocks 1012-1018 of FIG. 10. In at least some embodiments, calibration engine 736 may support multiple different calibration techniques that can be selectively applied per page group to obtain a desired balance between the number of reads performed in the course of read voltage threshold calibration and the degree of optimization of the voltage thresholds. For example, any given page group calibration can be performed utilizing a so-called "snap" calibration in which offsets for one or more voltage thresholds are determined for only a single sample physical page of the page group and then applied to all physical pages in the page group. The selection of the sample page can be random, based on characterization data, operational data (e.g., health), or round robin selection. A snap calibration includes a substantially lower number of calibration reads than a "normal" calibration in which the voltage offset for each of the read voltage thresholds of all physical pages in the page group is individually determined utilizing a limited range of voltage offsets (e.g., 3 voltage offsets higher and lower than each current read voltage threshold). This normal calibration technique, in turn, employs fewer calibration reads than an "extensive" calibration technique in which the voltage offset for each of the read voltage thresholds of all physical pages in the page group is individually determined utilizing a larger range of voltage offsets (e.g., all possible voltage offsets higher and lower than each current read voltage threshold). Following calibration of each page group, calibration engine 736 may optionally validate the calibration of that page group, as discussed below with respect to blocks 1022-1024 of FIG. 10 and FIG. 11. The calibration techniques used for full block calibration such as snap, normal or extensive calibration are efficient calibration techniques in most cases, but may in particular cases (e.g., when the variability within a page group is larger than expected) not be able to determine read voltage thresholds that enable all pages in the page group to successfully read. Further, the physical page that triggered the calibration may be among the ones that are not correctable. Although single page group calibration may also result in other pages in the page group not being correctable, single page group calibration has the advantage that the likelihood that the affected page will be readable is significantly higher. On the other hand, if calibration engine 736 only used single page group calibration, the total calibration overhead may significantly increase with higher variability within page groups as page groups would have to be recalibrated more frequently. Hence, the full block and single page group calibration techniques implemented by the calibration engine 736 are complementary.

Figure 10:
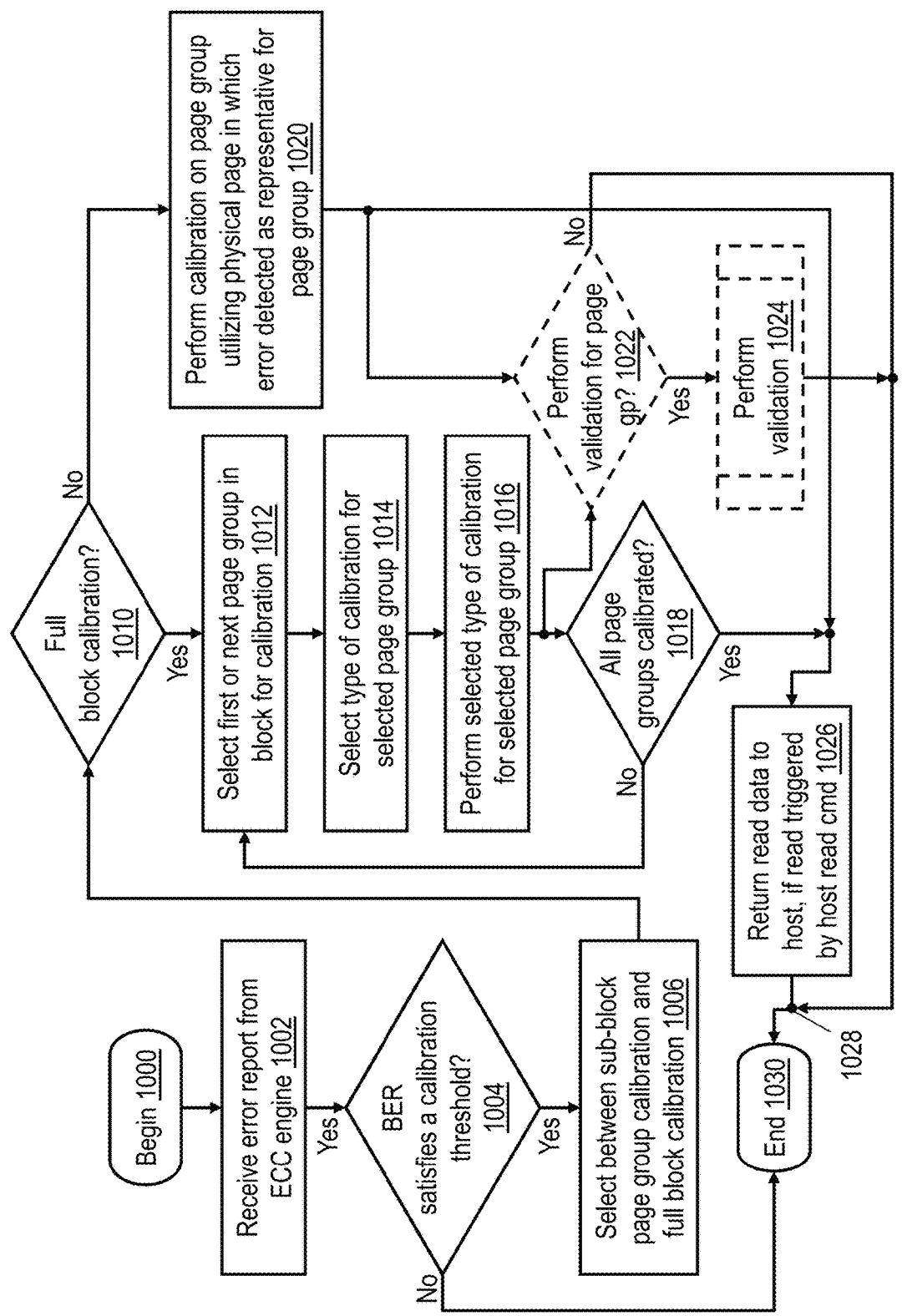
FIG. 10 is a high-level logical flowchart of an exemplary method by which a controller calibrates the read voltage thresholds of one or more page groups of a physical block of non-volatile memory in accordance with one embodiment.

Referring now to FIG. 10, there is depicted a high-level logical flowchart of an exemplary method by which a controller calibrates the read voltage thresholds of one or more page groups of a physical block of non-volatile memory in accordance with one embodiment. The illustrated process, which is described for ease of understanding with additional reference to the embodiment illustrated in FIG. 7, can be performed, for example, by GPP 132 and/or flash controller 140 of FIG. 2.

The process of FIG. 10 begins at block 1000 and then proceeds to block 1002, which illustrates background health checker 734 receiving, from ECC engine 732, an error report for a codeword read from NAND flash memory system 150 in response to a read command. In response to receipt of the error report, background health checker 734 determines at block 1004 whether or not the BER reported by ECC engine 732 for the codeword satisfies (e.g., is greater than or equal to) a calibration threshold. For example, background health checker 734 can set the calibration threshold at or below the BER at which the codeword becomes uncorrectable by ECC engine 732. In response to determining at block 1004 that the BER reported by ECC engine 732 does not satisfy the calibration threshold, the process of FIG. 10 ends at block 1030 until background health checker 734 receives a subsequent error report. If, however, background health checker 734 determines at block 1004 that the BER satisfies the calibration threshold, background health checker 734 selects a scope of calibration to be performed (block 1006).

In the illustrated example, at block 1006, background health checker 734 selects between performing a sub-block page group calibration of one or more page groups (hereafter assumed to be a single page group calibration of the page group containing the codeword that triggered the calibration, as shown in FIG. 9) and a full block calibration of all page groups in the block. Background health checker 734 can make the selection shown at block 1006 based on one or more criteria, such as the error count reported by ECC engine 732, the data retention duration, and/or the type of read command that caused the codeword in question to be read (e.g., host read, relocation read, read scrubber read, etc.). For example, in some embodiments, background health checker 734 preferentially selects a single page group calibration if the read command that caused the codeword to be read was a host read or relocation read and preferentially selects a full block calibration if the read command was issued by read scrubber 730. As illustrated by decision block 1010, if background health checker 734 selects a full block calibration at block 1006, calibration processing proceeds to block 1012 and following blocks. Alternatively, if background health checker 734 selects single page group calibration at block 1006, calibration processing proceeds to block 1020 and following blocks.

Referring now to block 1012, to perform a full block calibration, background health checker 734 selects a first page group (or on subsequent iterations, a next page group) of the block to be calibrated. Background health checker 734 may select the page group to be calibrated at block 1012, for example, based on a page group ordering that reduces read disturb and/or other undesirable page-to-page interference effects. In addition, at block 1014, background health checker 734 selects a calibration technique to be performed by calibration engine 736 for the selected page group. The calibration technique being selected may depend on various state information being tracked by the GPP 132 or flash controller 140. For example, at block 1014, background health checker 734 may select from among the snap, normal, and extensive calibration techniques described above with reference to FIG. 9. For example, background health checker 734 may make the selection depicted at block 1014 based on the BER of the codeword that triggered calibration, with one of the more resource-intensive types of calibration being performed for codewords having a higher BER and with one of the less resource-intensive types of calibration being performed for codewords having a lower BER.

At block 1016, background health checker 734 initiates the selected technique of calibration of the selected page group by calibration engine 736. In some embodiments, each physical page stores multiple codewords and the calibration only performs calibration reads to a single codeword in each physical page of the page group accessed in the course of calibration. Calibration engine 736 employs an iterative process that searches for the optimal read voltage thresholds. In this iterative process, calibration engine 736 issues multiple read commands utilizing different read voltage threshold offsets and selects those that minimize the number of errors detected by ECC engine 732. Upon completion of calibration of the page group, calibration engine 736 updates the Vth shift data 154 for the page group with the new offsets from default voltage thresholds. Following calibration of the selected page group at block 1016, the process of FIG. 10 bifurcates and proceeds in parallel to block 1018 and, if implemented, to optional block 1022, which is described below. Block 1018 illustrates background health checker 734 determining whether or not all page groups in the block have been calibrated. If not, the process returns to block 1012, which has been described. If, however, background health checker 734 determines at block 1018 that all page groups in the block have been calibrated by calibration engine 736, the process proceeds from block 1018 to block 1026, which is described below.

Referring now to block 1020, based on background health checker 734 selecting to perform single page group calibration, background health checker 734 initiates the calibration by calibration engine 736 of the page group containing the codeword that triggered the calibration. In a preferred embodiment, background health checker 734 causes calibration engine 736 to select the physical page storing the affected codeword that triggered calibration as the sample page representative of all pages in the page group. In some embodiments storing multiple codewords per physical page, background health checker 734 may further limit calibration reads to only the affected codeword that triggered the calibration. Calibration engine 736 can then employ the same iterative calibration reads described above with reference to block 1016 to determine the optimal read threshold voltages. In some embodiments or operating scenarios, following calibration of the read voltage thresholds for the affected codeword or the physical page storing the affected codeword, calibration engine 736 may update Vth shift data 154 with updated values indicating offsets of read voltage threshold from default voltage thresholds such that future read commands to the page group are serviced utilizing the updated read voltage thresholds. In other embodiments or operating scenarios, the read voltage threshold values determined by calibration engine 736 may instead be utilized to satisfy the read command triggering calibration, but not utilized to update Vth shift data 154. For example, garbage collector 720, wear leveler 722, pool balancer 724, read scrubber 730, or background health checker 734 may determine not to update Vth shift data 154 with new offsets for the read voltage threshold if data in the page group and/or block is likely to be relocated, for example, as discussed below with reference to block 1122 of FIG. 11. Following calibration of the single page group at block 1020, the process of FIG. 10 bifurcates and proceeds in parallel to block 1026 and, if implemented, to optional block 1022.

Block 1022 depicts background health checker 734 determining whether or not to perform validation for the page group for which calibration was performed at block 1016 or block 1020. For example, at block 1022, background health checker 734 may selectively bypass the validation in order to reduce overhead based on factors, such as the page type (e.g., lower page, upper page, extra page, top page, etc.), the change(s) in voltage threshold(s) made by calibration of the page group, block health, P/E cycle count, pre- and post-calibration BERs, the layer (wordline) position of the page group in the block, and/or the number of times the block, page group, or page has been read since programming. For example, in one embodiment, background health checker 734 may determine to bypass or forego validation based on the codeword that triggered the calibration being correctable by ECC engine 732. In other embodiments, background health checker 734 may determine to perform validation even if the codeword that triggered calibration was correctable by ECC engine 732 based on one or more factors indicating that the optimal read voltage threshold values for different codewords of a given physical page or codewords in different physical pages in the same page group may diverge. In response to a negative determination at block 1022, the branch of the process proceeds to join point 1028. If, however, background health checker 734 determines at block 1022 to perform validation for the page group, the process proceeds to block 1024, which illustrates background health checker 734 performing validation for the page group. An exemplary process for performing validation at block 1024 is described below with reference to FIG. 11. Following block 1024, the process proceeds to join point 1028.

Referring now to block 1026, if the read command that triggered the calibration of the read voltage thresholds is a host read command, the controller returns the requested read data (as read utilizing the newly calibrated read voltage thresholds and corrected, if needed, by ECC engine 732) to the host. Thereafter, the process of FIG. 10 proceeds to join point 1028, and once all page group validations, if any, initiated by the calibration have completed at block 1024, ends at block 1030.

Figure 11:
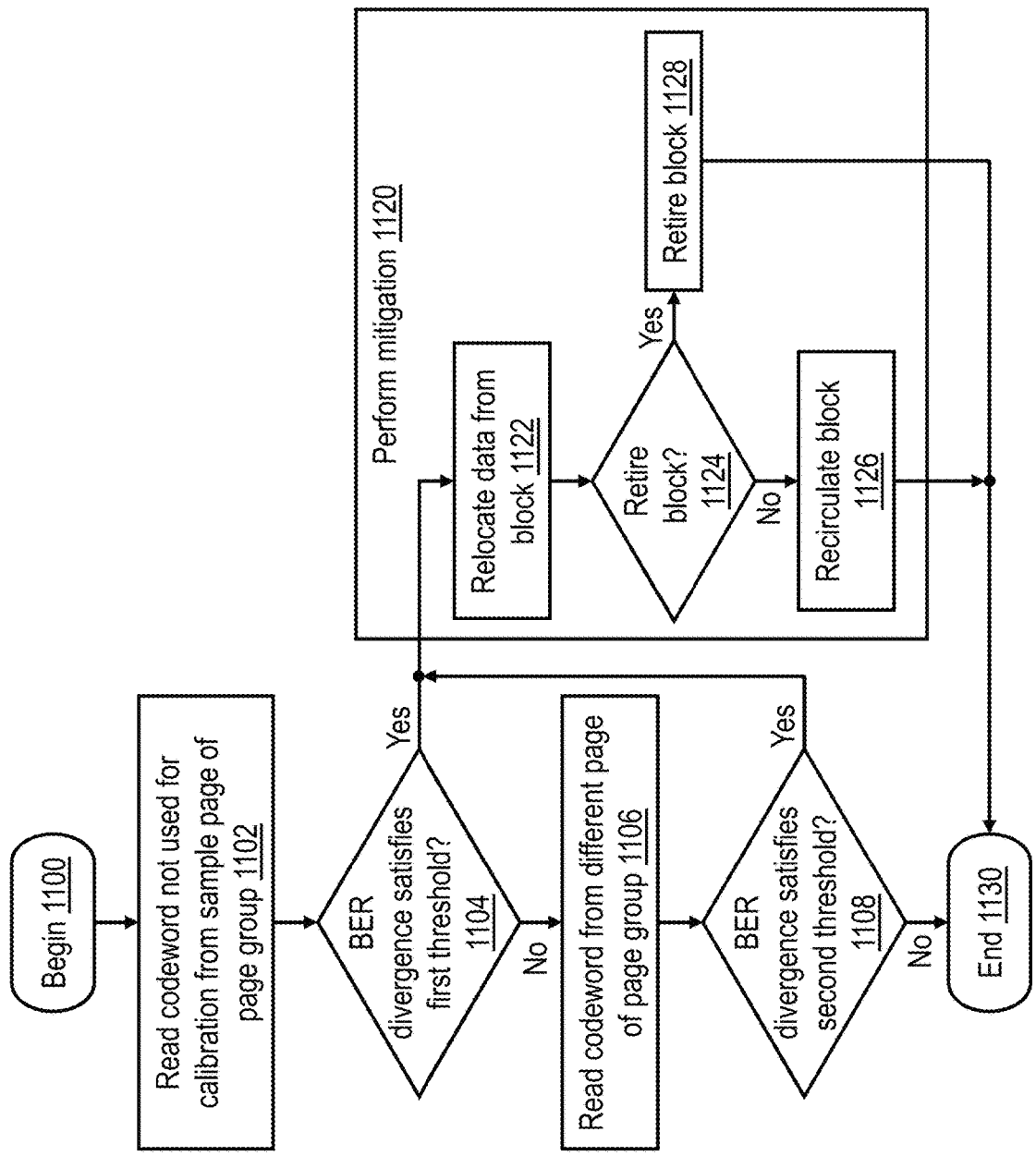
FIG. 11 is a high-level logical flowchart of an exemplary method by which a controller optionally validates the results of read voltage threshold calibration in accordance with one embodiment.

With reference now to FIG. 11, there is illustrated a high-level logical flowchart of an exemplary method by which a controller optionally validates the results of read voltage threshold calibration in accordance with one embodiment. The illustrated process can be performed, for example, by GPP 132 and/or flash controller 140 of FIG. 2, and presumes an embodiment in which each physical page stores multiple codewords.

The process of FIG. 11 begins at block 1100 and then proceeds to block 1102, which depicts background health checker 734 issuing a read command to read a codeword not used for calibration from a sample physical page of the relevant page group. For example, if single page group calibration was performed, codeword read at block 1102 is a different codeword in the same physical page as the affected codeword that triggered the calibration. If the page group was calibrated in the course of full block calibration, the codeword can be a codeword of a sample page representative of the page group that was not utilized to calibrate the page group. At block 1104, background health checker 734 determines whether or not a divergence between the post-calibration BER of the codeword utilized for calibration and the BER other codeword read at block 1102 satisfies (e.g., is greater than or equal to) a first divergence threshold. If so, background health checker 734 recognizes that the calibration was not successful in reducing BER across the affected physical page or sample physical page and accordingly performs mitigation at block 1120, as described below. If, however, background health checker 734 determines at block 1104 that the divergence between the BERs of the codewords does not satisfy the first divergence threshold, the process proceeds to block 1106.

Block 1106 depicts background health checker 734 issuing a read command to read a codeword not used for calibration from a physical page of the relevant page group other than the affected physical page or sample physical page. Background health checker 734 then determines at block 1108 whether or not a divergence between the post-calibration BER of the codeword utilized for calibration and the BER of the other codeword read at block 1106 satisfies (e.g., is greater than or equal to) a second divergence threshold. In various embodiments, the second divergence threshold can be the same or different than the first divergence threshold. In response to determining at block 1108 that the BER divergence satisfies the second divergence threshold, background health checker 734 recognizes that the calibration was not successful in reducing BER across the page group and accordingly performs mitigation at block 1120, as described below. If, however, background health checker 734 determines at block 1106 that the divergence between the BERs of the codewords does not satisfy the second divergence threshold, the calibration of the page group is validated as successful, and the validation process ends at block 1130.

Referring now to block 1120, in order to mitigate the BER divergence detected at block 1104 or block 1108, background health checker 734 can perform any of a variety of mitigation activities. In the depicted example, background health checker 734 triggers a relocation (e.g., by garbage collector 720) of all valid data in the block containing the page group that was calibrated (block 1122). Note that the relocation process may preferably make use of single page group calibration if needed for affected pages to read valid data. Background health checker 734 additionally determines at block 1124 whether or not to retire the block, for example, based on whether a threshold number of BER divergences have been detected in the block and/or whether the post-calibration BER of the sample page of the page group is substantially less than the correction limit of ECC engine 732. In response to block health checker 734 determining at block 1122 to not retire the block, the controller recirculates the block via erase queues 710, block erase function 712, and RTU queues 700, as described above (block 1126). Otherwise, the controller retires the block from use (block 1128). Following either block 1126 or block 1128, the process of FIG. 11 ends at block 1130.

As has been described, in at least one embodiment, a controller of a non-volatile memory detects errors in data read from a particular physical page of the non-volatile memory. Based on detecting the errors, the controller performs a read voltage threshold calibration for a page group including the particular physical page and a multiple other physical pages. Performing the read voltage threshold calibration includes calibrating read voltage thresholds based on only the particular physical page of the page group. After the controller performs the read voltage threshold calibration, the controller optionally validates the calibration. Validating the calibration includes determining whether bit error rates diverge within the page group and, if so, mitigating the divergence. Mitigating the divergence includes relocating data from the page group to another block of the non-volatile memory.

Advantageously, the described calibration techniques permit the controller to provide in-line calibration in the read data path and to thus respond more quickly to errors in the read data path. In addition, the described calibration techniques can guarantee that the physical page that caused calibration to be performed will be utilized as the sample physical page for its page group.

In at least some embodiments, the page group calibration can be incorporate into an existing calibration framework that also includes full block calibration. Based on one or more factors, the controller can determine an appropriate scope of calibration. For example, the controller may select full block calibration for calibrations triggered by read scrubber read commands and may select single page group calibration for calibration triggered by relocation read commands or host read commands.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the appended claims. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transmission media per se, transitory propagating signals per se, and forms of energy per se.

In addition, although embodiments have been described that include use of a NAND flash memory, it should be appreciated that embodiments of the present invention can also be used with other types of non-volatile random access memory (NVRAM) including, for example, magneto-resistive RAM (MRAM), ferroelectric RAM (FRAM), phase change memory (PCM), battery-backed DRAM, or other non-volatile memory technology, and combinations thereof.

The figures described above and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of read voltage threshold calibration in a non-volatile memory, the method comprising:
   a controller of the non-volatile memory detecting errors in data read from a particular physical page of the non-volatile memory; and
   based on detecting the errors, the controller performing a read voltage threshold calibration for a page group including the particular physical page and a multiple other physical pages, wherein performing the read voltage threshold calibration includes shifting read voltage thresholds of the particular physical page and all of the other multiple physical pages in the page group based on read voltage threshold shifts determined for only the particular physical page of the page group.

2. The method of claim 1, wherein:
   the particular physical page stores multiple codewords of data including a first codeword in which the errors were detected and a second codeword;
   performing the read voltage threshold calibration includes calibrating read voltage thresholds based on the first codeword and not the second codeword.

3. The method of claim 1, further comprising:
   the controller selecting a scope of calibration from among a single page group calibration that calibrates only a single page group and a full block calibration that calibrates all of multiple page groups in a block of non-volatile memory, wherein the scope of calibration includes the page group; and
   the controller performing the read voltage threshold calibration includes performing the read voltage threshold calibration for the selected scope of calibration.

4. The method of claim 3, wherein the selecting includes the controller selecting the full block calibration based on the data being read from the non-volatile memory in response to a read scrubber read command originated by the controller.

5. The method of claim 3, wherein the selecting includes the controller selecting the single page group calibration based on the data being read from the non-volatile memory in response to a host read command originated by a host.

6. The method of claim 1, further comprising:
   after the controller performs the read voltage threshold calibration, the controller validating the calibration, wherein validating the calibration includes:
      determining whether bit error rates diverge within the page group; and
      based on the controller determining whether bit error rates diverge within the page group, the controller mitigating the divergence, wherein the mitigating includes the controller relocating data from the page group to another block of the non-volatile memory.

7. The method of claim 1, wherein:
   the page group is a first page group; and
   the method further comprises:
      following read voltage threshold calibration of a second page group in the non-volatile memory, the controller determining a likelihood of divergence of bit error rates in the second page group; and
      based on determining a low likelihood of divergence of bit error rates in the second page group, the controller refraining from validating the read voltage threshold calibration of the second page group.

8. A program product, comprising:
   a storage device; and
   program code stored in the storage device and executable by a controller of a non-volatile memory to cause the controller to perform:
      detecting errors in data read from a particular physical page of the non-volatile memory; and
      based on detecting the errors, performing a read voltage threshold calibration for a page group including the particular physical page and a multiple other physical pages, wherein performing the read voltage threshold calibration includes shifting read voltage thresholds of the particular physical page and all of the other multiple physical pages in the page group based on read voltage threshold shifts determined for only the particular physical page of the page group.

9. The program product of claim 8, wherein:
   the particular physical page stores multiple codewords of data including a first codeword in which the errors were detected and a second codeword;
   performing the read voltage threshold calibration includes calibrating read voltage thresholds based on the first codeword and not the second codeword.

10. The program product of claim 8, wherein the program code further causes the controller to perform:
    selecting a scope of calibration from among a single page group calibration that calibrates only a single page group and a full block calibration that calibrates all of multiple page groups in a block of non-volatile memory, wherein the scope of calibration includes the page group; and
    wherein performing the read voltage threshold calibration includes performing the read voltage threshold calibration for the selected scope of calibration.

11. The program product of claim 10, wherein the selecting includes the controller selecting the full block calibration based on the data being read from the non-volatile memory in response to a read scrubber read command originated by the controller.

12. The program product of claim 10, wherein the selecting includes the controller selecting the single page group calibration based on the data being read from the non-volatile memory in response to a host read command originated by a host.

13. The program product of claim 8, wherein the program code further causes the controller to perform:
    after the controller performs the read voltage threshold calibration, validating the calibration, wherein validating the calibration includes:
       determining whether bit error rates diverge within the page group; and
       based on the controller determining whether bit error rates diverge within the page group, mitigating the divergence, wherein the mitigating includes the controller relocating data from the page group to another block of the non-volatile memory.

14. The program product of claim 8, wherein:
    the page group is a first page group; and
    the program code further causes the controller to perform:
       following read voltage threshold calibration of a second page group in the non-volatile memory, determining a likelihood of divergence of bit error rates in the second page group; and
       based on determining a low likelihood of divergence of bit error rates in the second page group, refraining from validating the read voltage threshold calibration of the second page group.

15. A method of controlling a non-volatile memory, the method comprising:
- a controller performing a read voltage threshold calibration for a page group including multiple physical pages of the non-volatile memory;
- after the controller performs the read voltage threshold calibration, the controller validating the calibration, wherein validating the calibration includes:
  - determining whether bit error rates diverge within the page group; and
  - based on the controller determining whether bit error rates diverge within the page group, the controller mitigating the divergence, wherein the mitigating includes the controller relocating data from the page group to another block of the non-volatile memory.

16. The method of claim 15, wherein:
the page group is a first page group; and
the method further comprises:
- following read voltage threshold calibration of a second page group in the non-volatile memory, the controller determining a likelihood of divergence of bit error rates in the second page group; and
- based on determining a low likelihood of divergence of bit error rates in the second page group, the controller refraining from validating the read voltage threshold calibration of the second page group.

17. The method of claim 16, wherein determining a likelihood of divergence of the bit error rates in the second page group includes determining the likelihood of divergence of the bit error rates based on at least one of the following set:
- a page type of a sample page of the second page group utilized in the read voltage calibration of the second page group;
- a physical layer of a memory chip containing the sample page; and
- a health of a block of the non-volatile memory including the second page group.

18. The method of claim 15, wherein determining whether bit error rates diverge within the page group includes determining whether bit error rates diverge between codewords in a particular page of the page group.

19. The method of claim 15, wherein determining whether bit error rates diverge within the page group includes determining whether bit error rates diverge between different physical pages of the page group.

20. The method of claim 15, wherein performing the read voltage threshold calibration includes calibrating read voltage thresholds for the page group based on only data read from a particular physical page of the page group in which errors were detected in response to a read command.

* * * * *